United States Patent [19]
Huang et al.

[11] Patent Number: 6,011,454
[45] Date of Patent: Jan. 4, 2000

[54] SUPERCONDUCTING MAGNET SUSPENSION ASSEMBLY

[76] Inventors: Xianrui Huang, 1017 Oak Chase La.; Gregory F. Hayworth, 214 South Calhoun Dr.; John Scaturro, Jr., 833 Stratton Dr., all of Florence, S.C. 29501

[21] Appl. No.: 09/223,514

[22] Filed: Dec. 30, 1998

[51] Int. Cl.⁷ .................................................. H01F 1/00
[52] U.S. Cl. .......................... 335/216; 335/299; 505/888; 220/901
[58] Field of Search .................................. 335/216, 299, 335/300; 324/318, 319, 320; 505/888–899; 62/50.1, 50.2, 51.1; 220/901

[56] References Cited

U.S. PATENT DOCUMENTS

| | | | |
|---|---|---|---|
| 4,496,073 | 1/1985 | Silver et al. ............................ | 220/445 |
| 5,539,367 | 7/1996 | Xu et al. ................................ | 335/301 |
| 5,812,043 | 9/1998 | Gore et al. ............................. | 335/216 |

*Primary Examiner*—Lincoln Donovan
*Attorney, Agent, or Firm*—Irving M. Freedman; Christian G. Cabou; Phyllis Y. Price

[57] ABSTRACT

A suspension system for a superconducting magnet for supporting and spacing the thermal radiation shield and vacuum vessel about the cryogen vessel utilizing a carbon fiber reinforced composite assembly with a first frustro-conical member positioned between the cryogen vessel and radiation shield and a second frustro-conical member extending from the vacuum vessel to overlap the radiation shield with a radially extending connecting member between the interior ends of the members to provide a tortuous generally Z-shaped lengthened thermal path and thermal resistance plus mechanical support in both the axial and radial directions.

17 Claims, 3 Drawing Sheets

FIG_1

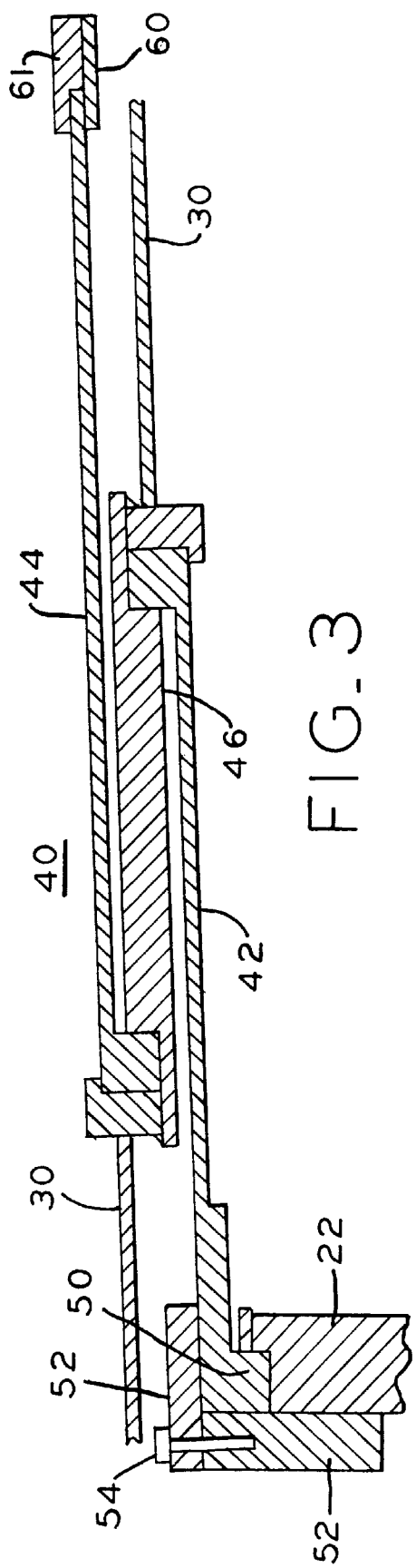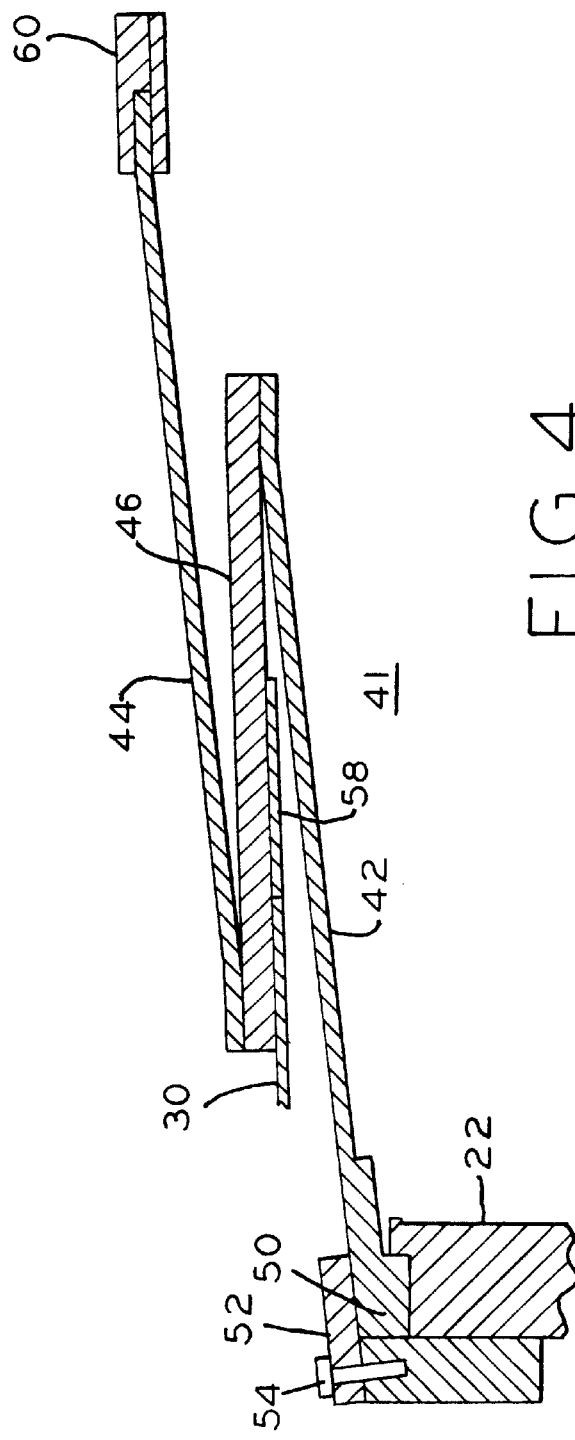

SUPERCONDUCTING MAGNET SUSPENSION ASSEMBLY

BACKGROUND OF INVENTION

This invention relates to a suspension system for a superconducting magnet assembly for a magnetic resonance imager (hereinafter called "MRI") and in particular to the suspension for an open architecture magnet assembly.

As is well known, a superconducting magnet can be made superconducting by placing it in an extremely cold environment, such as by enclosing it in a cryostat or pressure vessel containing liquid helium or other cryogen cryocoolant means. The extreme cold ensures that the magnet coils are superconducting, such that the coils can be operated in the persistent mode, that is when a power source is initially connected to the coil for a relatively short period of time to introduce a current flow through the coils and a superconducting switch is then closed, the current will continue to flow, thereby maintaining the coil current and a magnetic field. Superconducting magnets find wide application in the field of MRI.

Considerable research and development efforts have been directed at reducing magnet heat load and eliminating the need to continuously replenish the boiling liquid helium. While the use of liquid helium to provide cryogenic temperatures has been widely practiced and is satisfactory for MRI operation, the provision of a steady supply of liquid helium to MRI installations all over the world has proved to be difficult and costly. This has led to considerable effort being directed at superconducting materials and magnet structures in which the helium is recondensed and reused. This leads to the need for good thermal insulation between the cryostat and the ambient temperature.

Another problem encountered by most MRI equipments is that they utilize solenoidal magnets enclosed in cylindrical structures with a central bore opening for patient access. However, in such an arrangement, the patient is practically enclosed in the warm bore, which can induce claustrophobia in some patients. The desirability of an open architecture structure in which the patient is not essentially totally enclosed has long been recognized. Unfortunately, an open architecture structure poses a number of technical problems and challenges. One problem is to provide a suitable support structure which occupies much less space than conventional support structures, and yet which nevertheless can support the magnet assembly under the considerable electromagnetic forces and thermal forces encountered during operation.

The suspension system of an MRI magnet has to support the magnet mass, while providing adequate stiffness with minimal conduction heat leak. In addition to the mass and its dynamic load, an open architecture MRI suspension must support a large electromagnetic (EM) net force in each half of the magnet in the axial direction as well as a possible transverse EM force due to misalignment. The stiffness requirement in all directions is also more demanding in such an assembly in order to provide field stability under vibration. Moreover, all of the structural requirements should be met without significant increase of conduction heat leak through the suspension system. Good heat interception in the suspension is essential to bring the 4 K heat load within the cooling capacity of the magnet, particularly if helium recondensing is provided since the mechanical cryocooler in a recondensing system is frequently at, or near, its cooling capacity. Still further, the system has to be designed to accommodate the difference of thermal differential expansion and contraction between the aluminum helium vessel and the suspension system without complex and expansive machining.

All of the overlapping and conflicting requirements must be satisfied for a practical and satisfactory MRI superconducting magnet structure.

Thus, there is a particular need for a superconducting magnet structure and support assembly which overcomes the aforementioned problems while providing good mechanical support to resist the strong magnetic forces, along with good thermal insulation and isolation.

BRIEF DESCRIPTION OF DRAWINGS

FIG. 3 is a cross section including details of the support structure of FIGS. 1 and 2.

FIG. 4 is a cross section of a modified version of FIG. 3.

DETAILED DESCRIPTION OF THE INVENTION

Figure 1:
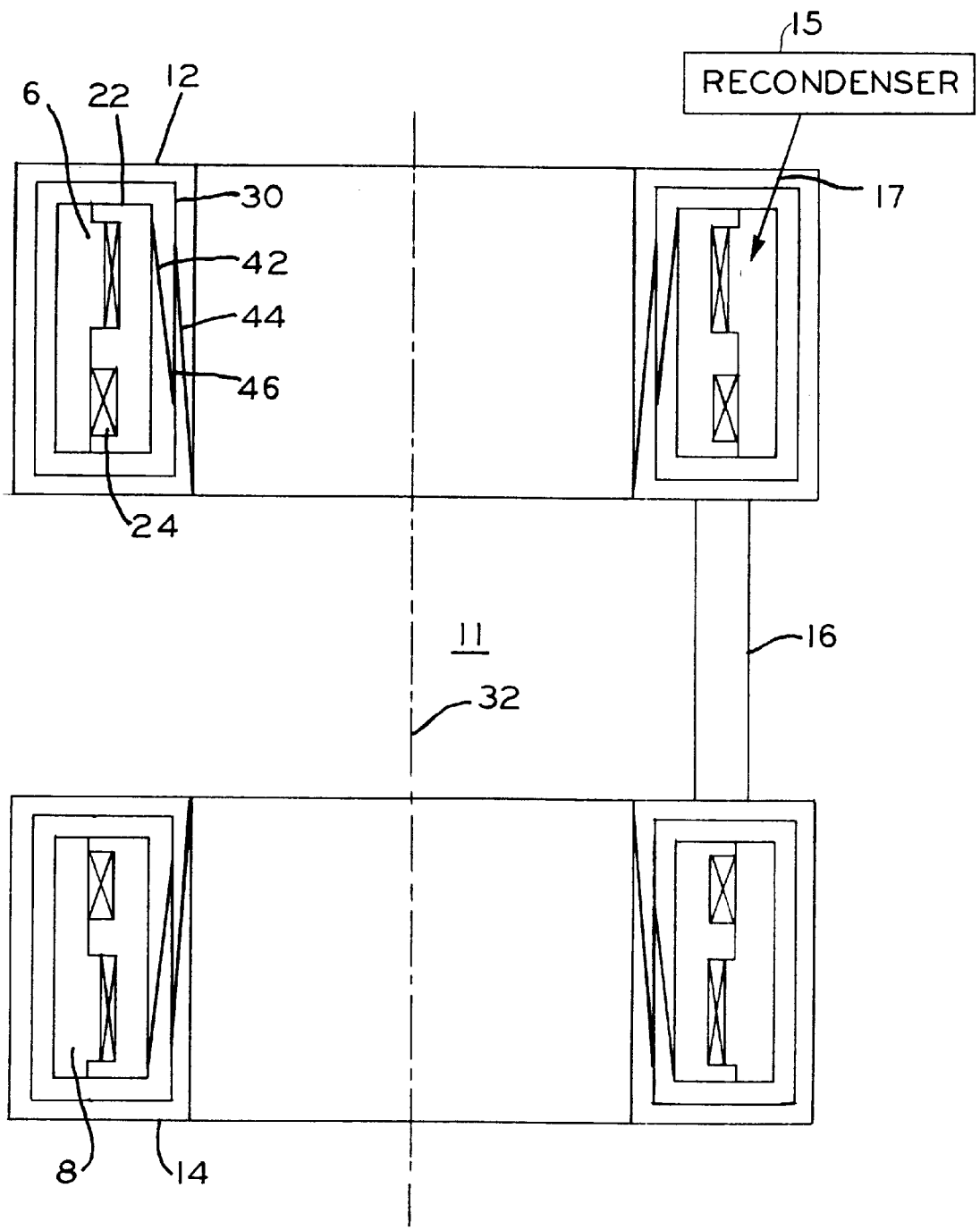
FIG. 1 is a simplified side view, partially cut away of an open architecture superconducting magnet assembly incorporating the invention.
Figure 2:
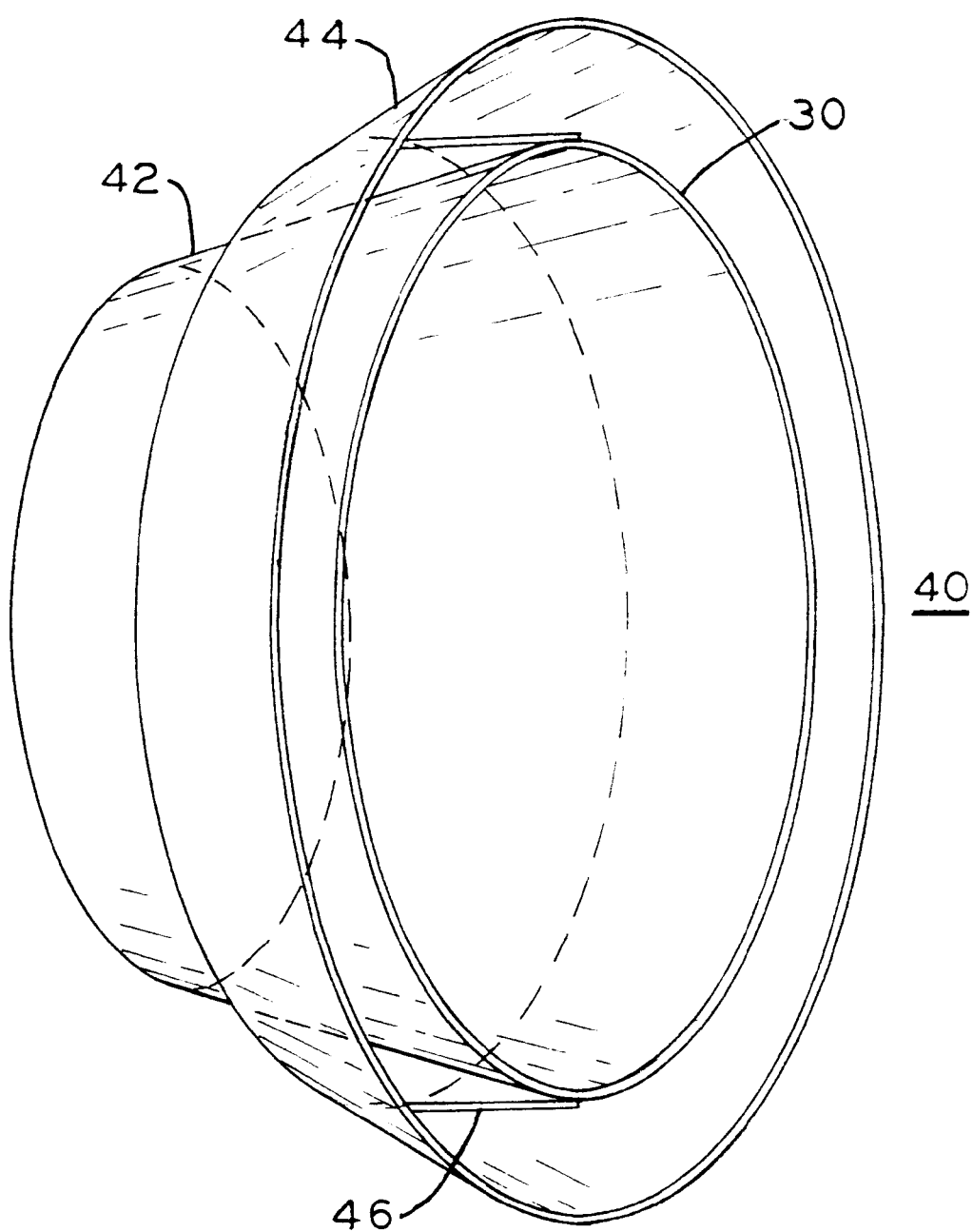
FIG. 2 is an enlarged simplified perspective view of the unitary support structure of FIG. 1 which is not to scale in order to better illustrate the invention.

Referring first to FIGS. 1 and 2, open architecture superconducting magnet assembly 10 includes a pair of separated solenoidal or cylindrical shaped vacuum vessels or housings 12 or 14 of superconducting magnets 6 and 8 separated by a support structure 16. The overall structure formed by vacuum vessels 12 and 14 and spacer posts 16 provides substantial openings or open space between the vacuum vessels which avoids a closure of the patient positioned in the open space or imaging region 11 around axis 32 of superconducting magnets 6 and 8. A plurality of main magnet coil shown generally as 24 within cryogen pressure vessel 22 provides a strong magnetic field in imaging region 11 upon cooling of magnet assembly 10 to superconducting temperatures (by conventional helium cooling means—not shown) and the initiation of superconducting magnet current flow. Recondenser 15 recondenses helium gas resulting from the boiling of helium in cooling superconducting magnets 6 and 8 to superconducting temperatures. The recondensed liquid helium flows back as indicated by arrow 17 to the superconducting magnets in a manner well known in the art.

The strong magnetic forces generated by superconducting magnets 6 and 8 result in large electromagnetic forces in the axial direction on the magnetic components within each superconducting magnet and also in a radial direction due to misalignment in the magnet. It is important that the magnet support system connecting between cryogen pressure vessel 22, thermal radiation shield 30 and vacuum vessel 12 have a large thermal resistance between cryogen vessel 22 and the much warmer (as much as over 300 K) exterior atmosphere outside superconducting magnet assembly 10. It has been found that carbon fiber reinforced composite (hereinafter "CFRP") provides desirable mechanical characteristics because of its high strength and high stiffness in both the axial and transverse or radial directions. In order to provide adequate thermal isolation and resistance to avoid unacceptable heat conduction in the limited radial space within vacuum vessel 12 generally conical shaped CFRP support assembly 40 includes 3 sections. A first generally frustro-conical or conical section 42 extends between cryogen pressure vessel 22 and thermal radiation shield 30, a second overlapping generally frustro-conical or conical section 44 connects thermal shield 30 and vacuum vessel 12, and a third or reentry section 46 connecting between conical sections 42 and 44. Reetnry section 46 is substantially cylindrical and concentric about axis 1.

CFRP support assembly 40 sections 42, 44 and 46 are wound and assembled together to form a unitary assembly or member as best illustrated in FIG. 2. The intermediate cylindrical reentrant cylinder 46 lengthens the thermal path of support assembly 40 and uses the same CFRP material to match the thermal shrinkage of the suspension cones 42 and 44. CFRP support assembly 40 as a result not only provides great strength in both the axial and radial directions, it also provides a lengthened generally Z-shaped thermal path which avoids unacceptable thermal conductivity which might otherwise occur because of the relatively short distance between cryogen pressure vessel 22 and vacuum vessel 12 within the confines of the open architecture superconducting magnets 6 and 8.

Details of construction of CFRP support assembly 40 along with the method of attachment to the members being supported are shown in FIGS. 3 and 4.

Referring to FIG. 3, conical members 42 and 44 and axial reentry cylinder 46 are wound from CFRP and joined together as shown. The attachment of frustro-conical section or member 42 to cryogen pressure vessel 22 includes CFRP reinforcement member 50 and pretension CFRP member 52 which includes screw mechanism 54 to provide the proper pretension to match the cryogen pressure vessel 22 cooldown shrinkage in order to reduce the thermal stress in CFRP support assembly 40. Aluminum cryogen pressure vessel 22 exhibits a much greater cool-down shrinkage during cooling from room temperature to cryogenic temperature than does the CFRP material forming support assembly 40. In order to provide the proper mechanical interface at both room and cryogenic temperatures, and to minimize the impact of thermal shrinkage differences, an expanding interface is provided.

CFRP reinforcement member 50 is made smaller than the cryogen pressure vessel interface 22 at room temperature resulting in a radial gap between reinforcement member 50 and pressure vessel 22. The diameter of reinforcement member 50 is smaller than cryogen pressure vessel 22 interface at room temperature but larger when they differentially shrink at superconducting temperatures such as 4.2 K. Screw mechanism 54 is used to close the gap during assembly by expanding the diameter of the reinforcement member. During cool down of cryogen pressure vessel 22 the pre-tension in reinforcement member 50 is relieved due to the differential thermal contraction of the two materials. As a result, the thermal stress induced in the CFRP due to differential thermal contraction is reduced. Stainless steel ring 60 is overlapped by stainless steel segment 61 to capture a step on CFRP member 44. This joint provides a weld surface 60 for the attachment of support assembly 40 to vacuum vessel 12.

FIG. 4 shows a slight modification of CFRP support assembly 40. Referring to FIG. 4, support assembly 41 includes the addition of segmented thin aluminum sheet 58 such as AL 1100 bonded to axial cylinder 46 to provide a mechanical and thermal joint between the suspension system support assembly 40 and thermal radiation shield 30 and to enhance the heat shielding or heat interception effect.

While the present invention has been described with respect to certain preferred embodiments thereof, it is to be understood that numerous variations and the details of construction, the arrangement and combination of parts, and the type of material used may be made without departing from the spirit and scope of the invention.

What is claimed is:

1. In a superconducting magnet suitable for magnetic resonance imaging and including a cylindrical cryogen pressure vessel concentric within a cylindrical vacuum vessel and a thermal radiation shield interposed between the vessels and extending along the axis thereof, a suspension system to position and maintain the spaced relationship between the cryogen pressure vessel, the thermal radiation shield and the vacuum vessel, said suspension system comprising:

a first support assembly extending between said cryogen pressure vessel and said radiation shield; and a second support assembly extending between said radiation shield and said vacuum vessel;

each of said support assemblies extending at an angle to and around said axis defining a frustro-conical surface with their small diameter ends closest to said cryogen vessel; and a central section contiguous to said radiation shield connecting the larger diameter end of said first support assembly and the smaller diameter end of said second support assembly such that said central section folds back toward said axis providing a lengthened thermal path.

2. The superconducting magnet suspension system of claim 1 wherein said central section is concentric with said axis and said support assemblies overlap and are secured to the ends of said reentry section in a generally Z-shaped configuration such that the thermal path of said suspension system in the radial direction from said axis is greater than the radial distance between said pressure vessel and said vacuum vessel.

3. The superconducting magnet suspension system of claim 2 wherein said support assemblies are carbon fiber reinforced composite.

4. The superconducting magnet suspension system of claim 3 wherein a segmented thin aluminum sheet is bonded to said carbon fiber reinforced composite.

5. The superconducting magnet suspension system of claim 4 wherein said aluminum sheet includes segments of aluminum spaced from each other.

6. The superconducting magnet suspension system of claim 2 wherein said support assemblies and said cylinder are bonded together into a single unit extending between said pressure vessel and said vacuum vessel and supporting said thermal radiation shield intermediate the ends thereof.

7. The superconducting magnet suspension system of claim 6 wherein a joint suitable for welding to said vacuum vessel in provided at the outer end of said second assembly includes opposed stainless steel rings to enclose said outer end of said second assembly.

8. The superconducting magnet suspension system of claim 7 wherein a joint member of pretensioned carbon fiber reinforced composite is provided at the inner end of said first assembly to minimize thermal stress between said support assembly and pressure vessel.

9. The superconducting magnet suspension system of claim 8 wherein said pressure vessel is aluminum.

10. The superconducting magnet suspension system of claim 2 wherein the larger diameter end of said first support assembly is positioned adjacent and within the smaller diameter end of said second support assembly.

11. In a superconducting open architecture magnet assembly suitable for magnetic resonance imaging and including a pair of superconducting magnets, each of said magnets including a cryogen pressure vessel concentrically within a vacuum vessel and a thermal radiation shield interposed between the vessels and extending along the axis thereof, a suspension system to position and maintain the spaced relationship between the cryogen pressure vessel, the thermal radiation shield and the vacuum vessel comprising:

a first and second frustro-conical overlapping supports with the overlap connected by a connecting member contiguous to said thermal radiation shield and with the remote ends of said frustro-conical supports extending between the radiation shield and the concentric pressure and vacuum vessels respectively;

said overlapping supports and connecting member providing a tortuous lengthened thermal path between said pressure and vacuum vessels while supporting said radiation shield at the junction of said first frustro-conical support and said first connecting member.

12. The superconducting magnet suspension system of claim 11 wherein said suspension system is wound carbon fiber reinforced composite.

13. The superconducting magnet suspension system of claim 12 wherein said junction of said cylinder includes thin aluminum segments providing thermal interception.

14. The superconducting magnet suspension system of claim 13 wherein said aluminum segments provide enhanced heat shielding.

15. The superconducting magnet suspension system of claim 12 wherein said magnet assembly includes helium cooling and a helium gas recondenser and said lengthened thermal path between said pressure and vacuum vessels reduces the thermal load on said recondenser.

16. The superconducting magnet suspension system of claim 15 wherein said vacuum vessel is stainless steel and said support extending between said vacuum vessel and said radiation shield includes a stainless steel ring overlapping by said carbon fiber reinforced composite to facilitate welding of said ring to said pressure vessel.

17. The superconducting magnet suspension system of claim 16 wherein said support assembly includes an adjustable pretension member for connection to said pressure vessel.

\* \* \* \* \*